United States Patent
Umeda et al.

(10) Patent No.: US 8,202,365 B2
(45) Date of Patent: Jun. 19, 2012

(54) PROCESS FOR PRODUCING ORIENTED INORGANIC CRYSTALLINE FILM, AND SEMICONDUCTOR DEVICE USING THE ORIENTED INORGANIC CRYSTALLINE FILM

(75) Inventors: Kenichi Umeda, Kanagawa-ken (JP); Hiroyuki Hirai, Kanagawa-ken (JP); Atsushi Tanaka, Kanagawa-ken (JP); Katsuhiro Kohda, Kanagawa-ken (JP); Kohei Higashi, Kanagawa-ken (JP); Hiroshi Sunagawa, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 331 days.

(21) Appl. No.: 12/337,072

(22) Filed: Dec. 17, 2008

(65) Prior Publication Data
US 2009/0152506 A1   Jun. 18, 2009

(30) Foreign Application Priority Data
Dec. 17, 2007 (JP) .................. 2007-324394

(51) Int. Cl.
*C30B 1/02* (2006.01)
(52) U.S. Cl. ............... 117/9; 117/7; 252/521.2; 427/58; 427/372.2
(58) Field of Classification Search .................. 252/500, 252/521.2; 428/700; 439/189; 427/58, 372.2; 117/7, 9
See application file for complete search history.

(56) References Cited

U.S. PATENT DOCUMENTS

| | | | | |
|---|---|---|---|---|
| 5,514,484 A * | 5/1996 | Nashimoto | ................ | 428/700 |
| 7,771,531 B2 * | 8/2010 | Tsuchiya et al. | ................ | 117/79 |
| 2006/0166537 A1 * | 7/2006 | Thompson et al. | ........... | 439/189 |
| 2007/0003877 A1 * | 1/2007 | Punsalan et al. | .............. | 430/311 |
| 2007/0298160 A1 * | 12/2007 | Jang et al. | ........................ | 427/58 |

FOREIGN PATENT DOCUMENTS

| JP | 05-000897 A | | 1/1993 |
|---|---|---|---|
| JP | 08330103 A | * | 12/1996 |

OTHER PUBLICATIONS

Translation of JP 08330103.*
Zinc oxide films prepared by sol-gel method, Li et al., Journal of Crystal Growth 275, 2005, 943-946.*

* cited by examiner

*Primary Examiner* — Mark Kopec
*Assistant Examiner* — Haidung Nguyen
(74) *Attorney, Agent, or Firm* — Sughrue Mion, PLLC

(57) ABSTRACT

In a process for producing an oriented inorganic crystalline film, a non-monocrystalline film containing inorganic crystalline particles is formed on a substrate by a liquid phase technique using a raw-material solution which contains a raw material and an organic solvent, where the inorganic crystalline particles have a layered crystal structure and are contained in the raw material. Then, the non-monocrystalline film is crystallized by heating the non-monocrystalline film to a temperature equal to or higher than the crystallization temperature of the non-monocrystalline film so that part of the inorganic crystalline particles act as crystal nuclei.

12 Claims, 2 Drawing Sheets

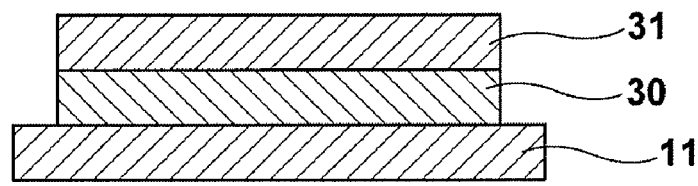
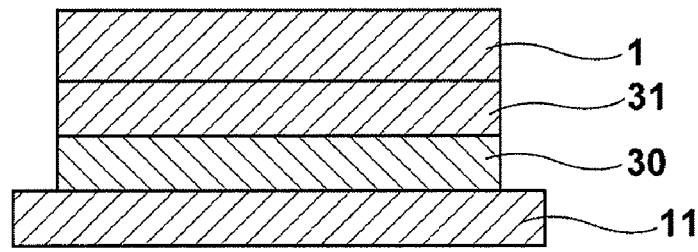
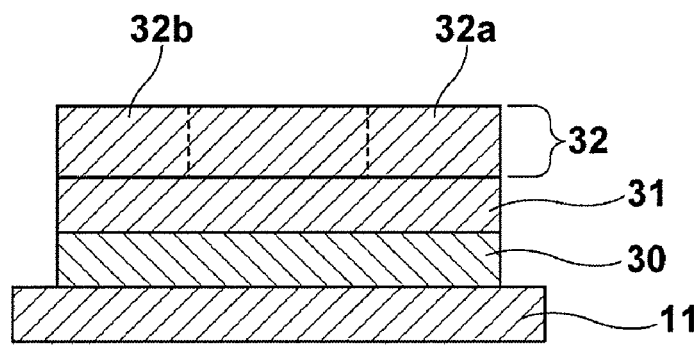
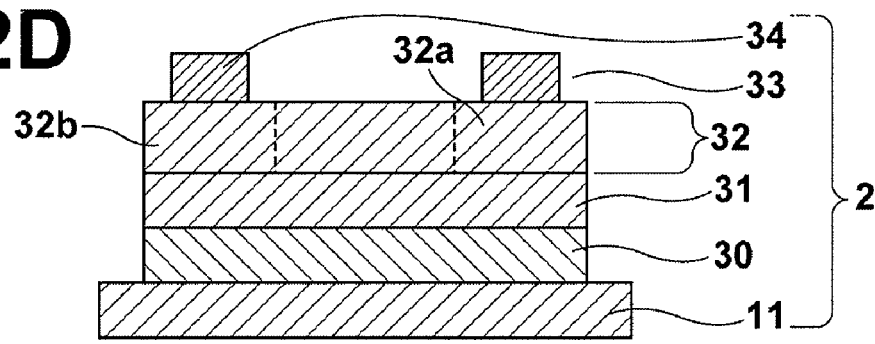

PROCESS FOR PRODUCING ORIENTED INORGANIC CRYSTALLINE FILM, AND SEMICONDUCTOR DEVICE USING THE ORIENTED INORGANIC CRYSTALLINE FILM

BACKGROUND OF THE INVENTION

1. Field of the Invention

The present invention relates to a process for producing an oriented inorganic crystalline film having a layered crystal structure, and the oriented inorganic crystalline film. In addition, the present invention also relates to a semiconductor device (such as a thin-film transistor (TFT)) using the oriented inorganic crystalline film.

2. Description of the Related Art

Recently, various flexible devices have been receiving attention. The use of the flexible devices is widely spread, and the flexible devices include, for example, electronic paper, flexible displays, and the like.

Conventionally, the flexible devices, as well as the devices using glass substrates, are mainly manufactured by vacuum film formation (such as sputtering or vacuum evaporation) and photolithographic patterning. However, the vacuum processes for the vacuum film formation and the photolithographic patterning are complex and entail high equipment cost. In addition, since unnecessary portions of uniformly formed films are removed, considerable amounts of materials are wasted.

Therefore, recently, the liquid phase techniques have been receiving attention because of the simplicity and the ability to reduce the cost. According to the liquid phase techniques, thin films are formed by using raw-material solutions containing the components of the thin films. The liquid phase techniques include, for example, application and printing (such as inkjet printing and screen printing). The liquid phase techniques do not need vacuum processes. In addition, since the patterning can be performed by direct imaging, the liquid phase techniques enable simple manufacture of devices at low cost.

For example, manufacturing of a TFT (to be mounted in a flexible display device) by a liquid phase technique is currently studied. Since the flexible devices use resin substrates having lower thermal resistivity than the inorganic substrate such as the glass substrate, the entire process of manufacturing a flexible device using a resin substrate is required to be executed under the thermal-resistance temperature of the resin substrate. Therefore, in the case where a TFT is produced by a liquid phase technique, use of organic materials for semiconductor layers is mainly studied. The thermal-resistance temperature of the resin substrate is normally 150 to 200° C., although the thermal-resistance temperature depends on the material. Even the thermal-resistance temperatures of the thermally resistant materials such as polyimides are approximately 300° C. at the highest.

Nevertheless, since the organic semiconductors tend to be inferior to the inorganic semiconductors in performance and durability, it is desirable that TFTs be formed of inorganic materials on a flexible substrate by use of a liquid phase technique. A known technique for forming an inorganic film by a liquid phase technique uses the sol-gel process. However, when a film is formed by use of the sol-gel process, the type and the orientation of a substrate underlying the film is reflected in the characteristics of the film. Since the flexible substrates are normally amorphous, an inorganic film formed immediately on a flexible substrate does not exhibit orientation.

In order that an inorganic film has satisfactory semiconductor characteristics, it is desirable that the inorganic film has crystalline orientation. For example, the electron mobility $\mu$ of a (001)-oriented film of an In—Ga—Zn—O-based material formed by vapor phase deposition is reported to be approximately 80 cm$^2$/VS, which is approximately eight times the electron mobilities of the amorphous or polycrystalline film of an In—Ga—Zn—O-based material.

Japanese Unexamined Patent Publication No. 5 (1993)-000897 (hereinafter referred to as JP5-897A) discloses a process for forming an orientated film of LiNbO3 on a base crystal by use of the sol-gel process, and a composite crystal produced by the process.

According to the technique disclosed in JP5-897A, the orientated film of $LiNbO_3$ is required to be formed on a substrate called a base crystal, and monocrystalline plates of sapphire, magnesium oxide, and the like are indicated as examples of the base crystal in JP5-897A. In addition, JP5-897A reports, that the film obtained by the above technique has the same face orientation as the base crystal.

Since most of the flexible substrates used in flexible devices are amorphous substrates as explained before, it is impossible to use the technique disclosed in JP5-897A in production of flexible devices. In the case where an inorganic film is formed on a flexible substrate through a base crystal as disclosed in JP5-897A, the inorganic film has the same orientation as the base crystal. However, in this case, the structure is complex, and the increased thickness can limit the flexibility.

Further, even in devices other than the flexible devices, it is also desirable that an oriented film be easily formed on an inexpensive amorphous substrate (such as a glass substrate) by using a liquid phase technique.

SUMMARY OF THE INVENTION

The present invention has been developed in view of the above circumstances.

The first object of the present invention is to provide a process for producing an oriented inorganic crystalline film which can be formed, by a liquid phase technique, immediately on an underlying layer not having orientation such as an amorphous substrate.

The second object of the present invention is to provide an oriented inorganic crystalline film produced by the process achieving the first object.

The third object of the present invention is to provide a semiconductor device using the oriented inorganic crystalline film achieving the second object.

In order to accomplish the first object, the first aspect of the present invention is provided. According to the first aspect of the present invention, there is provided a process for producing an oriented inorganic crystalline film. The process comprises the steps of: (A) forming on a substrate a non-monocrystalline film containing inorganic crystalline particles by a liquid phase technique using a raw-material solution which contains a raw material and an organic solvent, where the inorganic crystalline particles have a layered crystal structure and are contained in the raw material; and (B) crystallizing the non-monocrystalline film by heating the non-monocrystalline film to a temperature equal to or higher than the crystallization temperature of the non-monocrystalline film so that part of the inorganic crystalline particles act as crystal nuclei.

Preferably, the process according to the first aspect of the present invention may also have one or any possible combination of the following additional features (i) to (vii).

(i) The oriented inorganic crystalline film is preferably composed of oxide (and may contain inevitable impurities). In this case, it is particularly preferable that the oxide be a composite oxide expressed by a compositional formula, $$N_x M_y R_z O_{(x+3y/2+3z/2-d)},\quad (P)$$

where R is In, M is at least one of the elements In, Fe, Ga, and Al, N is at least one of the elements Zn and Mg, each of x, y, and z is a real number greater than zero, d indicates the amount of oxygen deficiency, and x, y, z, and d satisfy the relationship, $$0 \leq d \leq (x+3y/2+3z/2)/10.$$

(ii) The oriented inorganic crystalline film is preferably (00n) orientated, and n is a positive integer.

In this specification, the "oriented crystalline film" is defined as follows.

The I value of a crystalline film or a bulk crystal is defined as the greatest value of the (out-of-plane) X-ray diffraction peak intensities corresponding to crystal faces perpendicular to a crystal face from which the greatest X-ray diffraction peak intensity is observed among all the X-ray diffraction peaks observed in the crystalline film or the bulk crystal, where the X-ray diffraction peak intensity values are normalized so that the greatest X-ray diffraction peak intensity observed among all the X-ray diffraction peaks observed from the crystalline film or the bulk crystal value is equalized to one. When the I value of a crystalline film of a material on the basis of the X-ray diffraction peak intensity corresponding to an orientation does not exceed half of the corresponding I value of a bulk crystal of the material on the basis of the X-ray diffraction peak intensity corresponding to the orientation, the crystalline film is defined to be an oriented crystalline film having the orientation. In this definition, the area of the irradiation spot is assumed to be 1 cm².

For example, when the greatest value of the X-ray diffraction peak intensities corresponding to the (1m0) faces of a crystalline film of a material which are normalized so that the greatest value of the X-ray diffraction peak intensities corresponding to the (00n) face is equalized to one (i.e., the I value of the crystalline film on the basis of the greatest X-ray diffraction peak intensity corresponding to the (1 m0) faces) does not exceed half of the corresponding I value of a bulk crystal of the material (where m and n are positive integers), the crystalline film is determined to be a (00n)-oriented crystalline film.

TABLE 1

| R | M | N | Material | JCPDS Card No. | (00n) face (1m0) face | I value Reference Value/I value of Bulk | 2θ |
|---|---|---|---|---|---|---|---|
| In | In | Zn | In₂O₃(ZnO)₁₇ | 43-0621 | (0057) | 1 | 33.649 |
|    |    |    |              |         | (110)  | 0.145/0.29 | 56.039 |
|    | Fe | Mg Zn | InFeZnO₄ | 40-0250 | (009) | 1 | 30.807 |
|    |    |    |              |         | (110) | 0.285/0.59 | 55.258 |
|    | Ga | Mg Zn | InGaZnO₄ | 38-1104 | (00)  | 1 | 30.84 |
|    |    |    |              |         | (110) | 0.165/0.33 | 56.732 |
|    |    |    | InGaZn₃O₆ | 40-0253 | (0015) | 1 | 32.303 |
|    |    |    |              |         | (110) | 0.03/0.06 | 55.842 |
|    |    |    | InGaZn₄O₇ | 40-0254 | (0012) | 1 | 32.642 |
|    |    |    |              |         | (110) | 0.185/0.39 | 55.953 |
|    |    |    | InGaZn₅O₈ | 40-0255 | (0021) | 1 | 32.877 |
|    |    |    |              |         | (110) | 0.31/0.62 | 56.027 |
|    |    | Mg | InGaMgO₄ | 38-1106 | (009) | 1 | 10.233 |
|    |    |    |              |         | (110) | 0.11/0.22 | 55.585 |

TABLE 1-continued

| R | M | N | Material | JCPDS Card No. | (00n) face (1m0) face | I value Reference Value/I value of Bulk | 2θ |
|---|---|---|---|---|---|---|---|
|   | Al | Zn | InAlZnO₄ | 40-0258 | (009) | 1 | 30.548 |
|   |    |    |          |         | (110) | 0.275/0.55 | 55.512 |
|   |    | Mg | InAlMgO₄ | 40-1394 | (003) | 1 | 10.336 |
|   |    |    |          |         | (110) | 0.06/0.12 | 55.879 |

Table 1 shows reference crystal faces and reference I values of oriented crystalline films of major composite oxides which have the compositions expressed by the aforementioned compositional formula (P). The values indicated in Table 1 are the known standard data indicated in the JCPDS cards for the respective materials. The JCPDS cards are data files issued by Joint Committee on Powder Diffraction Standards. The JCPDS numbers are also indicated in Table 1. When the metal composition is deviated from the corresponding composition indicated in Table 1, the diffraction angle 2θ deviates from the corresponding value indicated in Table 1. However, when the deviation in the composition is so small as not to change the crystal system, the corresponding data indicated ion Table 1 can be used.

For example, the (009) face produces the greatest X-ray diffraction peak in the oriented crystalline film of InGaZnO₄ indicated in Table 1. Therefore, the degree of orientation of the oriented crystalline film of InGaZnO₄ is evaluated on the basis of the X-ray diffraction peak intensity corresponding to the (110) face which is normalized so that the X-ray diffraction peak intensity corresponding to the (009) face is equalized to one. As indicated in Table 1, the normalized X-ray diffraction peak intensity (the I value) corresponding to the (110) face of the bulk crystal of InGaZnO₄ is 0.33. Therefore, when the normalized X-ray diffraction peak intensity (the I value) corresponding to the (110) face of a crystalline film of InGaZnO₄ is equal to or smaller than 0.165, the crystalline film is determined to be a (009)-oriented crystalline film.

(iii) In step (A), the part of the inorganic crystalline particles may be dispersed in the non-monocrystalline film. Even in this case, the oriented inorganic crystalline film can be satisfactorily produced by the process according to the first aspect of the present invention.

(iv) The inorganic crystalline particles in the part preferably have an average diameter equal to or greater than 2 nm and smaller than the thickness of the non-monocrystalline film.

(v) The inorganic crystalline particles are preferably produced by a sol-gel process using a raw-material solution which contains an organic precursor material and an organic solvent, where the organic precursor material contains all the constituent elements of the oriented inorganic crystalline film.

(vi) The substrate is preferably an amorphous substrate such as a resin substrate or a glass substrate.

(vii) In step (B), the non-monocrystalline film is preferably crystallized by heating the non-monocrystalline film with thermic rays. In this case, the thermic rays are preferably pulsed laser rays.

In order to accomplish the second object, the second aspect of the present invention is provided. According to the second aspect of the present invention, there is provided an oriented inorganic crystalline film produced by the process according to the first aspect of the present invention.

Preferably, the oriented inorganic crystalline film according to the second aspect of the present invention is a semiconductor film.

In order to accomplish the third object, the third aspect of the present invention is provided. According to the third aspect of the present invention, there is provided a semiconductor device comprising the oriented inorganic crystalline film according to the second aspect of the present invention, where the oriented inorganic crystalline film is a semiconductor device.

The advantages of the present invention are described below.

In the process for producing an oriented inorganic crystalline film according to the first aspect of the present invention, the orientation of the oriented inorganic crystalline film can be controlled without utilizing the crystallinity or orientation of the layer underlying the non-monocrystalline film. Therefore, even when the underlying layer does not have orientation as an amorphous substrate, a randomly-oriented substrate, or the like, it is possible to form on the underlying layer the inorganic crystalline film so as to be oriented.

That is, in the process according to the first aspect of the present invention, it is possible to form an oriented inorganic crystalline film immediately on an unoriented underlying layer such as an amorphous substrate (which is inexpensive) by using a liquid phase technique (which is simple and entails low cost).

In particular, the process according to the first aspect of the present invention enables simple, low-cost manufacturing, by a liquid phase technique, of an oriented semiconductor film which is preferable for use as an active layer in a thin-film transistor (TFT) or the like. In addition, the use of the liquid phase technique enables patterning by direct imaging. That is, according to the first aspect of the present invention, a semiconductor device (such as a TFT) superior in the element characteristics (such as the carreer mobility) can be manufactured by using a simple, low-cost process.

DESCRIPTION OF THE DRAWINGS

FIGS. 2A, 2B, 2C, and 2D are cross-sectional views of the structures in representative steps in a process for producing a semiconductor device according to a second embodiment of the present invention.

DETAILED DESCRIPTION OF THE INVENTION

1. Oriented Inorganic Crystalline Film

Figure 1A:
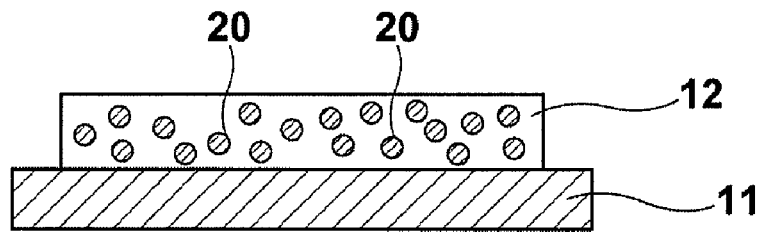
FIGS. 1A, 1B, 1C, and 1D are cross-sectional views of the structures in representative steps in a process for producing an oriented inorganic crystalline film according to a first embodiment of the present invention.

An oriented inorganic crystalline film according to the first embodiment of the present invention and a process for producing the oriented inorganic crystalline film are explained below with reference to FIGS. 1A, 1B, 1C, and 1D, which show cross sections (along the thickness direction) of the structures in representative steps in a process for producing the oriented inorganic crystalline film according to the first embodiment. In FIGS. 1A, 1B, 1C, and 1D, the respective elements are illustrated schematically, and the dimensions of the illustrated elements are differentiated from the dimensions of the corresponding elements in the actual device for clarification.

The oriented inorganic crystalline film 1 according to the first embodiment is formed of inorganic crystalline material having a layered crystal structure, although the oriented inorganic crystalline film 1 may contain inevitable impurities. The oriented inorganic crystalline film 1 can be produced by using a liquid phase technique.

The liquid phase technique used in the first embodiment is not specifically limited, and may be an application technique such as spin coating or dip coating, or a printing technique such as inkjet printing or screen printing.

The inorganic crystalline material having a layered crystal structure is not specifically limited, and may be, for example, a composite oxide expressed by the compositional formula,

$$N_x M_y R_z O_{(x+3y/2+3z/2-d)}, \quad (P)$$

where R is In, M is at least one of the elements In, Fe, Ga, and Al, N is at least one of the elements Zn and Mg, each of x, y, and z is a real number greater than zero, d indicates the amount of oxygen deficiency, and x, y, z, and d satisfy the relationship, $$0 \leq d \leq (x+3y/2+3z/2)/10.$$

The composite oxides expressed by the above compositional formula (P) in which d is not equal to zero exhibit electric conductivity. For example, the composite oxides expressed by the above compositional formula (P) in which R is In and M is Ga are referred to as IGZO, exhibit high optical transparency, and can be used as transparent oxide semiconductor materials.

Although the crystalline orientation of the oriented inorganic crystalline film 1 is not specifically limited, it is preferable that the oriented inorganic crystalline film 1 be (00n) oriented, where n is a positive integer. The composite oxides expressed by the compositional formula (P) have a property of being easily (00n) oriented.

The oriented inorganic crystalline film 1 according to the present embodiment can be used, for example, as a semiconductor active layer of a thin-film transistor (TFT). The semiconductor oxide films formed of the composite oxides expressed by the compositional formula (P) can be preferably used as the semiconductor active layers of thin-film transistors (TFTs).

2. Production Process of Oriented Inorganic Crystalline Film

A process for producing the oriented inorganic crystalline film according to the first embodiment is explained below.

2.1 First Stage (A)

In the first stage (A), first, a substrate 11 is prepared, and a non-monocrystalline film 12 containing inorganic crystalline particles 20 is formed on the substrate 11 by applying a raw-material solution to a surface of the substrate 11 as illustrated in FIG. 1A, where the raw-material solution contains an organic solvent and the inorganic crystalline particles 20, and the inorganic crystalline particles 20 contain the components of the oriented inorganic crystalline film 1.

Figure 1B:
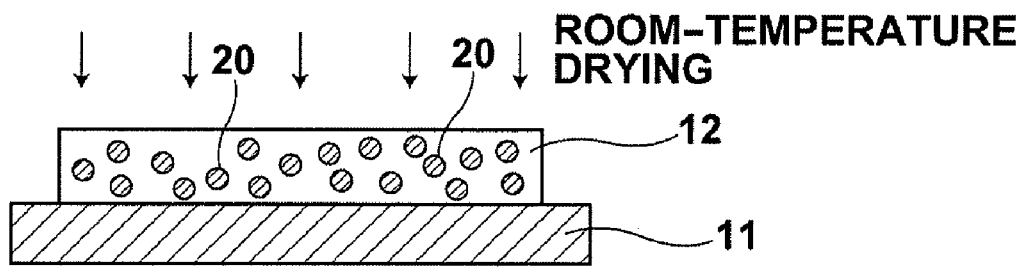

Preferably, most of the organic solvent in the non-monocrystalline film 12 is removed by drying at room temperature or the like as illustrated in FIG. 1B. In this step, the non-monocrystalline film 12 may be slightly heated (for example, to approximately 50° C.) within such a range in which crystallization does not proceed.

The substrate 11 is not specifically limited, and may be an amorphous substrate such as a resin or glass substrate. In addition, an insulation film or the like may be formed as an underlying layer on the substrate 11.

As explained before, according to the present invention, an oriented inorganic crystalline film can be formed immediately on an amorphous substrate or the like which is not oriented. The present invention is especially effective in the case where the substrate 11 is a resin substrate, which is normally amorphous. For example, in the TFTs for use in flexible display devices, the substrates of a resin such as polyethylene terephthalate (PET), polyethylene naphthalate (PEN), or a polyimide (PI) can be preferably used.

At least part of the inorganic crystalline particles 20 have such dimensions that each inorganic crystalline particle in the part can act as crystal nuclei in the following stage (B). The preferable average diameter of the inorganic crystalline particles 20 which can act as crystal nuclei in the following stage (B) is 2 nm or greater, and does not exceed the thickness of the non-monocrystalline film 12. If the average diameter of the inorganic crystalline particles 20 in the above part is smaller than 2 nm, it is difficult for the inorganic crystalline particles to act as crystal nuclei. In addition, inorganic crystalline particles having diameters greater than the thickness of the non-monocrystalline film 12 cannot act as crystal nuclei. For example, in the case where the oriented inorganic crystalline film is used as an active layer in various semiconductor devices, the average diameter of the inorganic crystalline particles 20 is preferably 50 nm or smaller. However, when the average diameter of the inorganic crystalline particles 20 in the above part is greater, the orientation characteristics of the oriented inorganic crystalline film become more superior. Therefore, it is more preferable that the inorganic crystalline particles have greater diameters as long as the average diameter of the inorganic crystalline particles 20 does not exceed 50 nm.

In the process according to the present embodiment, it is sufficient for the non-monocrystalline film 12 to contain the inorganic crystalline particles 20, and the inorganic crystalline particles 20 may be dispersed in the non-monocrystalline film 12. Although, generally, the non-monocrystalline film 12 can be crystallized by arranging crystal nuclei on a surface of a substrate, the process according to the present invention does not require arranging of crystal nuclei on the surface of the substrate 11.

Although the manner of production of the inorganic crystalline particles 20 is not specifically limited, the inorganic crystalline particles 20 are preferably produced by a sol-gel process using a raw-material solution which contains an organic precursor material and an organic solvent, where the organic precursor material contains all the constituent elements of the oriented inorganic crystalline film 1. For example, the organic precursor material may be a metal alkoxide compound or the like.

Although the manner of producing particles of the organic precursor material in the raw-material solution is not specifically limited in the case where the sol-gel process is used, the inorganic crystalline particles 20 can be produced, for example, by heating and stirring the raw-material solution (which contains the organic solvent and the organic precursor material) so as to produce the particles of the organic precursor material in the raw-material solution. In the case where the particles of the organic precursor material are produced by heating and stirring the raw-material solution, the diameters of the particles tend to increase with the heating temperature. The conditions of heating and stirring the raw-material solution should be determined so that the inorganic crystalline particles 20 have desired diameters.

After the inorganic crystalline particles 20 are produced in the raw-material solution, the raw-material solution becomes a dispersion solution of the inorganic crystalline particles 20, and the inorganic crystalline particles 20 are completely crystallized. However, the dispersion solution may contain particles of an organic-inorganic composite material, particles surface-modified with a surface-modification group, and other similar particles as well as the inorganic crystalline particles 20, where the particles of the organic-inorganic composite material are particles in a state before completion of the inorganic crystalline particles 20. The particles of the organic-inorganic composite material may also be able to act as crystal nuclei in the following stage (B).

Therefore, after the inorganic crystalline particles 20 are produced in the above manner, it is possible to apply the raw-material solution directly to the surface of the substrate 11. Further, since the above process for producing the inorganic crystalline particles 20 makes the amount of organic material in the raw-material solution becomes smaller than the amounts of organic material in the solutions which are normally applied in the sol-gel processes, the reduced amount of organic material in the raw-material solution facilitates satisfactory crystallization in the following stage (B). In the case where a liquid phase technique is used, ablation and the like are likely to occur during crystallization and affect the crystallinity when organic material remains, before the crystallization, in a film produced by application of a solution. Therefore, it is necessary to decompose the organic material, and it is preferable that the amount of organic material contained in the film produced by application of the solution be small. However, part of the organic precursor material may remain in the raw-material solution after the production of the inorganic crystalline particles 20 is completed.

The various application techniques and printing techniques mentioned before can be used in application of the raw-material solution. When one of the printing techniques is used, it is possible to directly draw a desired pattern.

2.2 Second Stage (B)

Figure 1C:
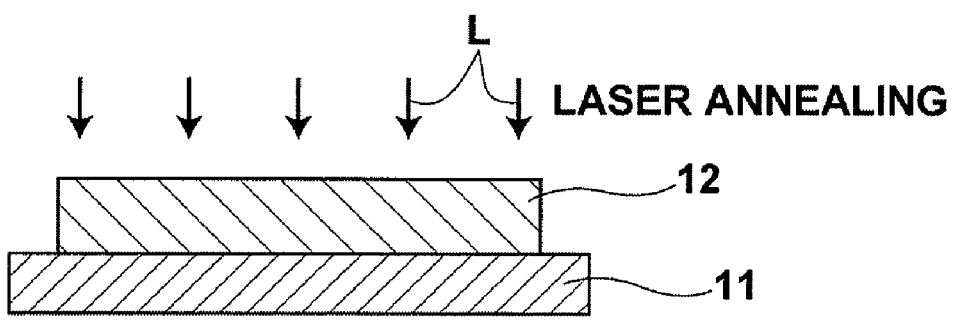
Figure 1D:
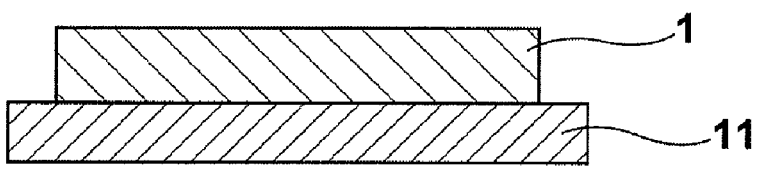

In the second stage (B), as illustrated in FIG. 1C, the non-monocrystalline film 12 is heated and crystallized. Specifically, the non-monocrystalline film 12 is heated to a temperature equal to or higher than the crystallization temperature of the non-monocrystalline film 12 so that part of the inorganic crystalline particles 20 act as crystal nuclei in the crystallization stage. Thus, the oriented inorganic crystalline film 1 according to the present invention is obtained as illustrated in FIG. 1D.

In the case where organic material remains in the non-monocrystalline film 12, it is necessary to decompose the organic material before or during the crystallization process in order to prevent the ablation caused by the remaining organic material. The decomposition temperature varies with the type of the organic material. In the case where the decomposition temperature of the organic material is lower than the heat-resistance temperature of the substrate 11, the organic material can be decomposed by heating.

On the other hand, in the case where the decomposition temperature of the organic material is higher than the heat-resistance temperature of the substrate 11, it is preferable to decompose the organic material by performing oxidation processing using an oxygen radical or the like. Such oxidation processing may be realized by irradiation with ultraviolet light having the wavelength of 300 nm or smaller in an atmosphere of oxygen or ozone, or by irradiation with oxygen plasma. The ultraviolet light having the wavelength of 300 nm or smaller may be emitted from a light source such as a mercury lamp or an excimer lamp.

Although the manner of crystallization is not specifically limited, the non-monocrystalline film 12 is preferably crystallized by heat treatment with thermic rays in the case where the heat resistivity of the substrate 11 is low. The heat treatment with thermic rays may be laser annealing, flash-lamp annealing, or the like. In the laser annealing, the non-monocrystalline film 12 is annealed and crystallized by scanning the non-monocrystalline film 12 with laser rays as the thermic rays. In the flash-lamp annealing, light emitted from a xenon flash lamp or the like is used as the thermic rays.

Since the laser annealing is scanning-type heat treatment using high-energy thermic rays, the laser annealing is superior in the crystallization efficiency, and allows control of the energy which reaches the substrate, by varying laser irradiation conditions such as the scanning speed and the laser power. Therefore, when the laser irradiation conditions are determined according to the thermal resistivity of the substrate, it is possible to maintain the temperature of the substrate below the heat-resistance temperature. Thus, the laser annealing is preferable in the case where the substrate has low thermal resistivity as the resin substrate.

The light source used in the laser annealing is not specifically limited, and may be a pulsed laser such as an excimer laser. In the case where the short-wavelength pulsed laser such as an excimer laser is used, a great amount of energy is absorbed in a surface layer, so that the energy which reaches the substrate can be easily controlled. Therefore, the short-wavelength pulsed laser such as an excimer laser is preferably used.

When the non-monocrystalline film 12 is heat treated at a temperature equal to or higher than the crystallization temperature of the non-monocrystalline film 12, part of the inorganic crystalline particles 20 having such dimensions as to able to become crystal nuclei act as crystal nuclei, and crystallization of the non-monocrystalline film 12 proceeds.

Since the inorganic crystalline particles 20 have a layered crystal structure, the inorganic crystalline particles 20 tend to be oriented along the face orientation of the formed crystalline layer. In addition, when the non-monocrystalline film 12 contains the inorganic crystalline particles 20 having a layered crystal structure, crystallization around each of the inorganic crystalline particles 20 proceeds so that a stable layered structure is formed around each of the inorganic crystalline particles 20. Therefore, the film obtained by the crystallization has orientation. That is, the oriented inorganic crystalline film 1 is obtained.

For example, the composite oxides having composition expressed by the aforementioned compositional formula (P) (such as $InGaZnO_4$) are considered to have a tendency to be c-axis oriented ((00n) oriented). Therefore, when the non-monocrystalline film 12 is crystallized in the above manner, it is possible to produce an oriented inorganic crystalline film 1 which is satisfactorily c-axis oriented.

In the case where the oriented inorganic crystalline film 1 is a semiconductor film, it is possible to dope a portion of the oriented inorganic crystalline film 1 with an impurity when necessary.

2.3 Advantages of the Process

As explained above, the process for producing the oriented inorganic crystalline film 1 according to the first embodiment comprises the steps of: (A) forming on the substrate 11 the non-monocrystalline film 12 containing inorganic crystalline particles 20 by a liquid phase technique using a raw-material solution which contains a raw material and an organic solvent, where the inorganic crystalline particles 20 have a layered crystal structure and are contained in the raw material; and (B) crystallizing the non-monocrystalline film 12 by heating the non-monocrystalline film 12 to a temperature equal to or higher than the crystallization temperature of the non-monocrystalline film 12 so that part of the inorganic crystalline particles 20 act as crystal nuclei in the crystallization stage. In such a process, the orientation of the oriented inorganic crystalline film 1 can be controlled without utilizing the crystallinity or orientation of the layer underlying the non-monocrystalline film 12. Therefore, even when the underlying layer does not have orientation as an amorphous substrate, a randomly-oriented substrate, or the like, it is possible to form the inorganic crystalline film 1 so as to be oriented.

Thus, in the process according to the first embodiment, it is possible to form an oriented inorganic crystalline film immediately on an unoriented underlying layer such as an amorphous substrate (which is inexpensive) by using a liquid phase technique (which is simple and entails low cost).

In particular, the process according to the first embodiment enables simple, low-cost manufacturing, by a liquid phase technique, of an oriented semiconductor film which is preferable for use as an active layer in a thin-film transistor (TFT) or the like. In addition, the use of the liquid phase technique enables patterning by direct imaging. Thus, according to the present invention, a semiconductor device (such as a TFT) superior in the element characteristics (such as the carrier mobility) can be manufactured by using a simple, low-cost process.

3. Semiconductor Device

Next, the structure of a semiconductor device according to the second embodiment of the present invention and a process for producing the semiconductor device are explained below with reference to FIGS. 2A, 2B, 2C, and 2D, which show cross sections (along the thickness direction) of the structures in representative steps in the process for producing the semiconductor device according to the second embodiment. In FIGS. 2A, 2B, 2C, and 2D, the respective elements are illustrated schematically, and the dimensions of the illustrated elements are differentiated from the dimensions of the corresponding elements in the actual device for clarification.

The semiconductor device according to the second embodiment is a thin-film transistor (TFT) as a bottom-gate type semiconductor device, and uses the oriented inorganic crystalline film I according to the first embodiment of the present invention. Specifically, the semiconductor device (TFT) 2 according to the second embodiment comprises a substrate 11, a gate electrode 30, a gate insulation film 31, a semiconductor active layer 32, a source electrode 33, and a drain electrode 34 as illustrated in FIG. 2D, where the semiconductor active layer 32 is produced by using the oriented inorganic crystalline film 1 according to the first embodiment.

The process for producing the above semiconductor device (TFT) is as follows.

First, the substrate 11 is prepared, and the gate electrode 30 and the gate insulation film 31 are formed on the substrate 11 as illustrated in FIG. 2A. The substrate 11 in the semiconductor device (TFT) 2 is similar to the substrate 11 on which the oriented inorganic crystalline film 1 according to the first embodiment is formed, the gate electrode 30 is formed of $n^+Si$ or the like, and the gate insulation film 31 is formed of $SiO_2$ or the like.

Then, as illustrated in FIG. 2B, a semiconductor film 1 is formed on the gate insulation film 31 in a similar manner to the oriented inorganic crystalline film 1 in the first embodiment. The semiconductor film 1 is similar to the oriented inorganic crystalline film 1. Since the oriented inorganic crystalline film 1 can be formed by application of a solution, no vacuum process is necessary. In particular, when a raw-material solution as illustrated in FIG. 1A is applied to the gate insulation film 31 in a manner similar to the stage (A) in the process according to the first embodiment by printing such as inkjet printing or screen printing, patterning can be performed by direct imaging. That is, the oriented inorganic crystalline film 1 can be directly patterned so that the oriented inorganic crystalline film 1 is left on only the areas on which elements of the TFT are to be formed. The semiconductor film (oriented inorganic crystalline film) 1 is preferably formed of a metal oxide having the composition expressed by the aforementioned compositional formula (P).

Thereafter, a source region 32a and a drain region 32b are formed in the semiconductor film 1 as illustrated in FIG. 2C, so that the semiconductor active layer 32 of the TFT 2 is realized. In the semiconductor active layer 32, the region between the source region 32a and the drain region 32b becomes a channel region.

Finally, the source electrode 33 and drain electrode 34 are respectively formed on the source region 32a and the drain region 32b as illustrated in FIG. 2D.

Since the semiconductor active layer 32 in the semiconductor device (TFT) 2 is produced by the process according to the present invention as explained above, the semiconductor active layer 32 has satisfactory orientation, and can be patterned by direct imaging. Therefore, the semiconductor device (TFT) 2 is superior in the element characteristics (such as the carrier mobility), and can be produced by a simple, low-cost process.

Further, the oriented inorganic crystalline film 1 according to the first embodiment can also be used in any other semiconductor devices.

4. EVALUATION OF EXAMPLES

The present inventors have produced concrete examples 1, 2, 3, 4, 5, and 6 of the oriented inorganic crystalline films according to the present invention and comparison examples 1, 2, 3, and 4 of inorganic crystalline films as indicated below.

4.1 Concrete Example 1

The concrete example 1 of the oriented inorganic crystalline film according to the present invention has been produced as follows.

First, a film of $Zn_xGa_yIn_zO_{(x+3y/2+3z/2-d)}$ (which is hereinafter referred to as IGZO) has been formed by using crystalline nanoparticles of IGZO, which have been produced by a sol-gel process, where x, y, and z are real numbers greater than zero, and satisfy the relationship, $$0 \leq d \leq (x+3y/2+3z/2)/10.$$

A raw-material solution to be applied to a substrate has been prepared as follows. A solution having a light-yellow color (hereinafter referred to as the solution A) has been prepared by mixing 2.2 g of zinc acetate dihydrate, 2.47 g of gallium isopropoxide, and 2.74 g of indium isopropoxide into cyclohexanol and stirring the mixture at 150° C. The relative composition (the ratio between molar fractions) In:Ga:Zn of the solution B has been measured as 1.08:1:1 by ICP (inductively coupled plasma) spectroscopy. Then, a solution having a dark-green color in which crystalline nanoparticles are dispersed (hereinafter referred to as the solution B) is prepared by heating and stirring the solution A at 250° C. in an autoclave for an hour so as to produce the crystalline nanoparticles. The average diameter of the crystalline nanoparticles dispersed in the solution B has been measured on the basis of observation by a TEM (transmission electron microscope). Specifically, a copper grid having a diameter of 3 mm has been evaporated with carbon, and a sample of the solution B with a controlled concentration of 10 mmol/l has been dropped onto the copper grid and dried. Then, the crystalline nanoparticles in the dried solution have been observed to have an average diameter of approximately 10 nm by an electronic microscope JEM-1200EX, manufactured by JEOL Ltd, where the average diameter of the crystalline nanoparticles has been obtained by converting the area of the TEM image of each crystalline nanoparticle into the diameter of a circle having the same area.

Next, a non-monocrystalline film has been formed by applying the solution B twice to a quartz substrate by spin coating (where the substrate is rotated at 1000 rpm), and drying the applied solution at room temperature. The non-monocrystalline film at this stage (i.e., after the drying at room temperature) has been analyzed by XRD (X-ray diffraction), and only amorphous structures have been observed.

Subsequently, the above non-monocrystalline film dried at room temperature has been heated and baked at 1000° C. in an electric furnace so as to be crystallized. Then, the crystallized non-monocrystalline film has been analyzed by XRD. The greatest X-ray diffraction intensity has been observed at the diffraction angle 2θ of 30.8 degrees, which corresponds to the (009) face, and the normalized X-ray diffraction peak intensity at the diffraction angle 2θ of 55.7 degrees corresponding to the (110) face (i.e., the I value) of the crystallized non-monocrystalline film has been measured as 0.08. Table 1 shows that when the I value of an IGZO film does not exceed 0.165, the IGZO film is a c-axis oriented crystalline film. Therefore, the crystallized non-monocrystalline film obtained as above has been confirmed to be a satisfactorily c-axis oriented inorganic crystalline film.

Finally, a gold electrode has been formed on the crystallized non-monocrystalline film by evaporation, and the electron mobility μ has been estimated to be 10.1 $cm^2/VS$ on the basis of AC Hall measurement.

4.2 Comparison Example 1

The comparison example 1 of an inorganic crystalline film has been produced as follows.

The inorganic crystalline film as the comparison example 1 is different from the concrete example 1 in that the solution A per se is applied to the substrate without producing the solution B (i.e., without producing the crystalline nanoparticles). The solution A has been observed by a TEM, and no particle has been found in the solution A.

The solution A applied to the substrate is dried at room temperature so as to form a non-monocrystalline film on the substrate, and then the non-monocrystalline film is baked at 1000° C. in an electric furnace in order to crystallize the non-monocrystalline film. The crystallized non-monocrystalline (IGZO) film has been analyzed by XRD, and the I value of the crystallized non-monocrystalline film on the basis of the XRD intensity at the diffraction angle 2θ of 55.7 degrees corresponding to the (110) face has been obtained as 0.20. That is, the inorganic crystalline film as the comparison example 1 has been found not to be c-axis oriented.

Finally, a gold electrode has been formed on the crystallized non-monocrystalline film by evaporation, and the electron mobility μ has been estimated to be 1.2 $cm^2/VS$ on the basis of AC Hall measurement.

4.3 Comparison of Concrete Example 1 and Comparison Example 1

The production conditions, the dimensions of the crystalline nanoparticle (seed crystals), the I values on the basis of the XRD intensity corresponding to the (110) face, the observed states of orientation, and the electron mobilities of the concrete example 1 of the oriented inorganic crystalline film according to the present invention and the comparison example 1 of the inorganic crystalline film are summarized in Table 2.

TABLE 2

| IGZO | Substrate | Heated with | Solution Heating Temperature | Size of Seed Crystal | I Value (110) | c-axis Orientation | Mobility cm$^2$/VS |
|---|---|---|---|---|---|---|---|
| Concrete Example 1 | Quartz | Electric Furnace 1000° C. | 250° C. | Approx. 10 nm | 0.09 | ○ | 10.1 |
| Concrete Example 2 | Quartz | Laser | 250° C. | Approx. 10 nm | 0.08 | ○ | 8.5 |
| Concrete Example 3 | Quartz | Laser | 230° C. | Approx. 5 nm | 0.10 | ○ | 5.3 |
| Concrete Example 4 | Quartz | Laser | 200° C. | Approx. 2 to 3 nm | 0.13 | ○ | 2.6 |
| Concrete Example 5 | PET/SiO$_2$ | Laser | 250° C. | Approx. 10 nm | 0.09 | ○ | 6.1 |
| Comparison Example 1 | Quartz | Electric Furnace 1000° C. | 150° C. | No | 0.20 | X | 1.2 |
| Comparison Example 2 | Quartz | Laser | 150° C. | No | 0.19 | X | 0.8 |
| Comparison Example 3 | PET/SiO$_2$ | Laser | 150° C. | No | 0.20 | X | 0.4 |

As indicated in Table 2, it has been confirmed that the inorganic (IGZO) crystalline film has satisfactory orientation and therefore exhibits relatively high electron mobility in the case where the crystalline nanoparticles are produced in a raw-material solution before the raw-material solution is applied to the substrate in the process of producing the inorganic (IGZO) crystalline film, while the inorganic (IGZO) crystalline film has unsatisfactory orientation and therefore exhibits relatively low electron mobility in the case where the conventional sol-gel process is simply used without producing crystalline nanoparticles in a raw-material solution before the raw-material solution is applied to the substrate in the process of producing the inorganic (IGZO) crystalline film.

4.4 Concrete Example 2

The concrete example 2 of the oriented inorganic (IGZO) crystalline film according to the present invention is different from the concrete example 1 in that the non-monocrystalline film has been crystallized by laser annealing. In the laser annealing, the non-monocrystalline film has been irradiated with the KrF excimer laser light having the wavelength of 248 nm, the laser irradiation power has been controlled by use of an attenuator, and the number of laser shots has been 200. The most superior crystallinity has been obtained when the laser irradiation power is 103 mJ/cm$^2$.

The IGZO film crystallized as above has been analyzed by XRD. The greatest X-ray diffraction intensity has been observed at the diffraction angle 2θ of 30.8 degrees, which corresponds to the (009) face, and the normalized X-ray diffraction peak intensity at the diffraction angle 2θ of 55.7 degrees corresponding to the (110) face (i.e., the I value) of the crystallized non-monocrystalline film has been measured as 0.08. On the basis of the reference value 0.165 indicated in Table 1, the crystallized non-monocrystalline film obtained as above has been confirmed to be a satisfactorily c-axis oriented inorganic crystalline film.

Finally, a gold electrode has been formed on the crystallized non-monocrystalline film by evaporation, and the electron mobility μ has been estimated to be 8.5 cm$^2$/VS on the basis of AC Hall measurement.

4.5 Concrete Example 3

The concrete example 3 of the oriented inorganic (IGZO) crystalline film according to the present invention is different from the concrete example 1 in that the solution B is prepared by heating and stirring the solution A at 230° C. (instead of 250° C.) for an hour, and the non-monocrystalline film has been crystallized by laser annealing with the KrF excimer laser light (as the concrete example 2).

The solution B prepared as above has a russet color. After the solution B has been prepared, the relative composition (the ratio between molar fractions) In:Ga:Zn has been measured as 1.05:1:1, and the average diameter of the crystalline nanoparticles dispersed in the solution B has been measured to be approximately 5 nm.

Thereafter, a non-monocrystalline IGZO film has been formed in a similar manner to the concrete example 1, and crystallized by laser annealing in a similar manner to the concrete example 2. Specifically, the non-monocrystalline film has been irradiated with the KrF excimer laser light having the wavelength of 248 μm, the laser irradiation power is 82 mJ/cm$^2$, and the number of laser shots has been 200.

The IGZO film crystallized as above has been analyzed by XRD. The greatest X-ray diffraction intensity has been observed at the diffraction angle 2θ of 30.8 degrees, which corresponds to the (009) face, and the normalized X-ray diffraction peak intensity at the diffraction angle 2θ of 55.7 degrees corresponding to the (110) face (i.e., the I value) of the crystallized non-monocrystalline film has been measured as 0.10. On the basis of the reference value 0.165 indicated in Table 1, the crystallized non-monocrystalline film obtained as above has been confirmed to be a satisfactorily c-axis oriented inorganic crystalline film.

Finally, a gold electrode has been formed on the crystallized non-monocrystalline film by evaporation, and the electron mobility μ has been estimated to be 5.3 cm$^2$/VS on the basis of AC Hall measurement.

4.6 Concrete Example 4

The concrete example 4 of the oriented inorganic (IGZO) crystalline film according to the present invention is different from the concrete example 1 in that the solution B is prepared by heating and stirring the solution A at 200° C. (instead of 250° C.) for an hour, and the non-monocrystalline film has been crystallized by laser annealing with the KrF excimer laser light (as the concrete example 2).

The solution B prepared as above has a russet color. After the solution B has been prepared, the relative composition (the ratio between molar fractions) In:Ga:Zn has been measured as 1.06:1.1:1, and the average diameter of the crystalline nanoparticles dispersed in the solution B has been measured to be approximately 2 to 3 nm.

Thereafter, a non-monocrystalline IGZO film has been formed in a similar manner to the concrete example 1, and crystallized by laser annealing in a similar manner to the concrete example 2. Specifically, the non-monocrystalline film has been irradiated with the KrF excimer laser light having the wavelength of 248 nm, the laser irradiation power is 82 mJ/cm$^2$, and the number of laser shots has been 200.

The IGZO film crystallized as above has been analyzed by XRD. The greatest X-ray diffraction intensity has been observed at the diffraction angle 2θ of 30.8 degrees, which corresponds to the (009) face, and the normalized X-ray diffraction peak intensity at the diffraction angle 2θ of 55.7 degrees corresponding to the (110) face (i.e., the I value) of the crystallized non-monocrystalline film has been measured as 0.13. On the basis of the reference value 0.165 indicated in Table 1, the crystallized non-monocrystalline film obtained as above has been confirmed to be a satisfactorily c-axis oriented inorganic crystalline film.

Finally, a gold electrode has been formed on the crystallized non-monocrystalline film by evaporation, and the electron mobility μ has been estimated to be 2.6 cm$^2$/VS on the basis of AC Hall measurement.

4.7 Concrete Example 5

The concrete example 5 of the oriented inorganic (IGZO) crystalline film according to the present invention is different from the concrete example 1 in that the substrate is prepared by forming a SiO$_2$ film having the thickness of 100 nm on a substrate of PET (polyethylene terephthalate), and the non-monocrystalline film has been crystallized by laser annealing with the KrF excimer laser light (as the concrete example 2).

Thereafter, a non-monocrystalline IGZO film has been formed on the above substrate in a similar manner to the concrete example 1, and crystallized by laser annealing in a similar manner to the concrete example 2. Specifically, the non-monocrystalline film has been irradiated with the KrF excimer laser light having the wavelength of 248 nm, the laser irradiation power is 82 mJ/cm$^2$, and the number of laser shots has been 200.

The IGZO film crystallized as above has been analyzed by XRD. The greatest X-ray diffraction intensity has been observed at the diffraction angle 2θ of 30.8 degrees, which corresponds to the (009) face, and the normalized X-ray diffraction peak intensity at the diffraction angle 2θ of 55.7 degrees corresponding to the (110) face (i.e., the I value) of the crystallized non-monocrystalline film has been measured as 0.09. On the basis of the reference value 0.165 indicated in Table 1, the crystallized non-monocrystalline film obtained as above has been confirmed to be a satisfactorily c-axis oriented inorganic crystalline film.

Finally, a gold electrode has been formed on the crystallized non-monocrystalline film by evaporation, and the electron mobility μ has been estimated to be 6.1 cm$^2$/VS on the basis of AC Hall measurement.

4.8 Comparison Example 2

The comparison example 2 of an inorganic crystalline film has been produced as follows.

First, a non-monocrystalline film is formed in a similar manner to the comparison example 1 by applying the solution A per se to the substrate without producing the solution B (i.e., without producing the crystalline nanoparticles).

Then, the non-monocrystalline film has been crystallized by laser annealing. In the laser annealing, the non-monocrystalline film has been irradiated with the KrF excimer laser light having the wavelength of 248 nm, the laser irradiation power is 82 mJ/cm$^2$, and the number of laser shots has been 200.

The crystallized non-monocrystalline (IGZO) film has been analyzed by XRD, and the I value of the crystallized non-monocrystalline film on the basis of the XRD intensity at the diffraction angle 2θ of 55.7 degrees corresponding to the (110) face has been obtained as 0.19. That is, the inorganic crystalline film as the comparison example 2 has been found not to be c-axis oriented.

Finally, a gold electrode has been formed on the crystallized non-monocrystalline film by evaporation, and the electron mobility μ has been estimated to be 0.8 cm$^2$/VS on the basis of AC Hall measurement.

4.9 Comparison Example 3

The comparison example 3 of an inorganic crystalline film has been produced as follows.

First, a non-monocrystalline film is formed on a substrate in a similar manner to the comparison example 1 by applying the solution A per se to the substrate without producing the solution B (i.e., without producing the crystalline nanoparticles). However, the substrate is prepared in advance by forming a SiO$_2$ film on a substrate of PET (polyethylene terephthalate) in a similar manner to the concrete example 5.

Then, the non-monocrystalline film has been crystallized by laser annealing. In the laser annealing, the non-monocrystalline film has been irradiated with the KrF excimer laser light having the wavelength of 248 nm, the laser irradiation power is 82 mJ/cm$^2$, and the number of laser shots has been 200.

The crystallized non-monocrystalline (IGZO) film has been analyzed by XRD, and the I value of the crystallized non-monocrystalline film on the basis of the XRD intensity at the diffraction angle 2θ of 55.7 degrees corresponding to the (110) face has been obtained as 0.20. That is, the inorganic crystalline film as the comparison example 3 has been found not to be c-axis oriented.

Finally, a gold electrode has been formed on the crystallized non-monocrystalline film by evaporation, and the electron mobility μ has been estimated to be 0.4 cm$^2$/VS on the basis of AC Hall measurement.

4.10 Comparison of Concrete Examples and Comparison Examples

The production conditions, the dimensions of the crystalline nanoparticle (seed crystals), the I values on the basis of the XRD intensity corresponding to the (110) face, the observed states of orientation, and the electron mobilities of the concrete examples 2 to 5 of the oriented inorganic crystalline film according to the present invention and the comparison examples 2 and 3 of the inorganic crystalline film are also summarized in Table 2. The results indicated in Table 2 show that each of the inorganic (IGZO) crystalline films has satisfactory orientation and therefore exhibits relatively high electron mobility in the case where the crystalline nanoparticles are produced in a raw-material solution before the raw-material solution is applied to the substrate in the process of producing the inorganic (IGZO) crystalline film, while each of the inorganic (IGZO) crystalline films has unsatisfactory orientation and therefore exhibits relatively low electron mobility in the case where the conventional sol-gel process is simply used without producing crystalline nanoparticles in a raw-material solution before the raw-material solution is applied to the substrate in the process of producing the inorganic (IGZO) crystalline film. The above difference in the performance between the case where the crystalline nanoparticles are produced in a raw-material solution and the case where the conventional sol-gel process is simply used without producing crystalline nanoparticles in a raw-material solution has been observed in either of the inorganic crystalline films formed on a quartz film and the inorganic crystalline films formed on a PET substrate on which a $SiO_2$ film is formed. In addition, the results indicated in Table 2 show that IGZO films having more superior orientation are formed by using raw-material solutions containing greater crystalline nanoparticles which can act as crystal nuclei in the crystallization stage.

4.11 Concrete Example 6

The concrete example 1 of the oriented inorganic crystalline film according to the present invention has been produced as follows.

First, a film of $Zn_xAl_yIn_zO_{(x+3y/2+3z/2-d)}$ (which is hereinafter referred to as IAZO) has been formed by using crystalline nanoparticles of IAZO, which have been produced by a sol-gel process, where each of x, y, and z is a real number greater than zero, d indicates the amount of oxygen deficiency, and x, y, z, and d satisfy the relationship, $$0 \leq d \leq (x+3y/2+3z/2)/10.$$

A raw-material solution to be applied to a substrate has been prepared as follows. A solution having a light-yellow color (hereinafter referred to as the solution C) has been prepared by mixing 2.2 g of zinc acetate dihydrate, 2.04 g of aluminum isopropoxide, and 2.74 g of indium isopropoxide into cyclohexanol and stirring the mixture at 150° C. The relative composition (the ratio between molar fractions) In:Al:Zn of the solution D has been measured as 1.05:0.9:1 by ICP (inductively coupled plasma) spectroscopy. Then, a solution having a dark-green color in which crystalline nanoparticles are dispersed (hereinafter referred to as the solution D) is prepared by heating and stirring the solution C at 250° C. in an autoclave for an hour so as to produce the crystalline nanoparticles. The average diameter of the crystalline nanoparticles dispersed in the solution D has been measured on the basis of observation by a TEM (transmission electron microscope) in a similar manner to the concrete example 1, and the crystalline nanoparticles in the dried solution have been observed to have an average diameter of approximately 10 nm.

Next, a non-monocrystalline film has been formed by applying the solution D twice to a quartz substrate by spin coating (where the substrate is rotated at 1000 rpm), and drying the applied solution at room temperature. The non-monocrystalline film at this stage (i.e., after the drying at room temperature) has been analyzed by XRD (X-ray diffraction), and only amorphous structures have been observed.

Subsequently, the above non-monocrystalline film dried at room temperature has been heated and baked at 950° C. in an electric furnace so as to be crystallized. Then, the crystallized non-monocrystalline film has been analyzed by XRD. The greatest X-ray diffraction intensity has been observed at the diffraction angle 2θ of 30.548 degrees, which corresponds to the (009) face, and the normalized X-ray diffraction peak intensity at the diffraction angle 2θ of 55.512 degrees corresponding to the (110) face (i.e., the I value) of the crystallized non-monocrystalline film has been measured as 0.18. Table 1 shows that when the I value of an IAZO film does not exceed 0.275, the IAZO film is a c-axis oriented crystalline film. Therefore, the crystallized non-monocrystalline film obtained as above has been confirmed to be a satisfactorily c-axis oriented inorganic crystalline film.

Finally, a gold electrode has been formed on the crystallized non-monocrystalline film by evaporation, and the electron mobility μ has been estimated to be 5.2 $cm^2/VS$ on the basis of AC Hall measurement.

4.12 Comparison Example 4

The comparison example 4 of an inorganic crystalline film has been produced as follows.

The inorganic crystalline film as the comparison example 4 is different from the concrete example 6 in that the solution C per se is applied to the substrate without producing the solution B (i.e., without producing the crystalline nanoparticles). The solution C has been observed by a TEM, and no particle has been found in the solution C.

The solution C applied to the substrate is dried at room temperature so as to form a non-monocrystalline film on the substrate, and then the non-monocrystalline film is baked at 950° C. in an electric furnace in order to crystallize the non-monocrystalline film. The crystallized non-monocrystalline (IAZO) film has been analyzed by XRD, and the I value of the crystallized non-monocrystalline film on the basis of the XRD intensity at the diffraction angle 2θ of 55.512 degrees corresponding to the (110) face has been obtained as 0.30. That is, the inorganic crystalline film as the comparison example 4 has been found not to be c-axis oriented.

Finally, a gold electrode has been formed on the crystallized non-monocrystalline film by evaporation, and the electron mobility μ has been estimated to be 0.8 $cm^2/VS$ on the basis of AC Hall measurement.

4.13 Comparison of Concrete Example 6 and Comparison Example 4

The production conditions, the dimensions of the crystalline nanoparticle (seed crystals), the I values on the basis of the XRD intensity corresponding to the (110) face, the observed states of orientation, and the electron mobilities of the concrete example 6 of the oriented inorganic crystalline film according to the present invention and the comparison example 4 of the inorganic crystalline film are summarized in Table 3.

TABLE 3

| IAZO | Substrate | Heated with | Solution Heating Temperature | Size of Seed Crystal | I Value (110) | c-axis Orientation | Mobility $cm^2/VS$ |
|---|---|---|---|---|---|---|---|
| Concrete Example 6 | Quartz | Electric Furnace 950° C. | 250° C. | Approx. 10 nm | 0.18 | ○ | 5.2 |
| Comparison Example 4 | Quartz | Electric Furnace 950° C. | 150° C. | No | 0.30 | X | 0.8 |

As indicated in Table 3, it has been confirmed that the inorganic (IAZO) crystalline film has satisfactory orientation and therefore exhibits relatively high electron mobility in the case where the crystalline nanoparticles are produced in a raw-material solution before the raw-material solution is applied to the substrate in the process of producing the inorganic (IAZO) crystalline film, while the inorganic (IAZO) crystalline film has unsatisfactory orientation and therefore exhibits relatively low electron mobility in the case where the conventional sol-gel process is simply used without producing crystalline nanoparticles in a raw-material solution before the raw-material solution is applied to the substrate in the process of producing the inorganic (IAZO) crystalline film.

5. Industrial Usability

The oriented inorganic crystalline film according to the present invention can be preferably used as active layers in semiconductor devices (such as thin-film transistors (TFTs)), solar cells, thermoelectric devices, and other similar devices, and can also be used as transparent conductive films such as transparent electrodes.

What is claimed is:

1. A process for producing an oriented inorganic crystalline film, comprising the steps of:
   (A) forming on a substrate a non-monocrystalline film containing inorganic crystalline particles by a liquid phase technique using a raw-material solution which contains a raw material and an organic solvent, wherein the raw material contains the inorganic crystalline particles and the inorganic crystalline particles have a layered crystal; and
   (B) crystallizing said non-monocrystalline film by heating the non-monocrystalline film to a temperature equal to or higher than a crystallization temperature of the non-monocrystalline film so that part of the inorganic crystalline particles act as crystal nuclei.

2. A process according to claim 1, wherein said part of the inorganic crystalline particles are dispersed in said non-monocrystalline film in said step (A).

3. A process according to claim 1, wherein said oriented inorganic crystalline film is composed of an oxide and inevitable impurities.

4. A process according to claim 3, wherein said oxide is a composite oxide expressed by a compositional formula,

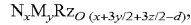

$N_x M_y R z_{O_{(x+3y/2+3z/2-d)}}$, where R is In, M is at least one of In, Fe, Ga, and Al, N is at least one of Zn and Mg, each of x, y, and z is a real number greater than zero, d indicates an amount of oxygen deficiency, and x, y, z, and d satisfy the relationship, $0 \leq d \leq (x+3y/2+3z/2)/10$.

5. A process according to claim 1, wherein said oriented inorganic crystalline film is (00n) orientated, and n is a positive integer.

6. A process according to claim 1, wherein said inorganic crystalline particles in said part have an average diameter equal to or greater than 2 nm and smaller than a thickness of said non-monocrystalline film.

7. A process according to claim 1, wherein said inorganic crystalline particles are produced by a sol-gel process using a solution which contains an organic precursor material and an organic solvent, and the organic precursor material contains all constituent elements of said oriented inorganic crystalline film.

8. A process according to claim 1, wherein said substrate is an amorphous substrate.

9. A process according to claim 8, wherein said substrate is a resin substrate.

10. A process according to claim 8, wherein said substrate is a glass substrate.

11. A process according to claim 1, wherein said non-monocrystalline film is crystallized in said step (B) by heating the non-monocrystalline film with thermic rays.

12. A process according to claim 11, wherein said thermic rays are pulsed laser rays.

* * * * *

UNITED STATES PATENT AND TRADEMARK OFFICE
CERTIFICATE OF CORRECTION

PATENT NO. : 8,202,365 B2
APPLICATION NO. : 12/337072
DATED : June 19, 2012
INVENTOR(S) : Kenichi Umeda et al.

It is certified that error appears in the above-identified patent and that said Letters Patent is hereby corrected as shown below:

Col. 20, lines 4-12, Claim 4 should read:

4. A process according to claim 3, wherein said oxide is a composite oxide expressed by a compositional formula, where R is In, M is at least one of In, Fe, Ga, and Al, N is at least one of Zn and Mg, each of x, y, and z is a real number greater than zero, d indicates an amount of oxygen deficiency, and x, y, z, and d satisfy the relationship, $0 \leq d \leq (x + 3y/2 + 3z/2)/10$.

Signed and Sealed this
Twenty-third Day of October, 2012

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 8,202,365 B2 | Page 1 of 1 |
| APPLICATION NO. | : 12/337072 | |
| DATED | : June 19, 2012 | |
| INVENTOR(S) | : Kenichi Umeda et al. | |

It is certified that error appears in the above-identified patent and that said Letters Patent is hereby corrected as shown below:

Col. 20, lines 4-12, Claim 4 should read:

-- 4. A process according to claim 3, wherein said oxide is a composite oxide expressed by a compositional formula, $$N_xM_yR_zO_{(x+3y/2+3z/2-d)},$$

where R is In, M is at least one of In, Fe, Ga, and Al, N is at least one of Zn and Mg, each of x, y, and z is a real number greater than zero, d indicates an amount of oxygen deficiency, and x, y, z, and d satisfy the relationship, $$0 \leq d \leq (x + 3y/2 + 3z/2)/10. \text{ --.}$$

This certificate supersedes the Certificate of Correction issued October 23, 2012.

Signed and Sealed this
Twenty-second Day of January, 2013

David J. Kappos
*Director of the United States Patent and Trademark Office*